United States Patent

Shoji et al.

[11] 4,301,393
[45] Nov. 17, 1981

[54] AUTOMATIC Y-AXIS OFFSET SYSTEM

[75] Inventors: Koji Shoji; Yoshinobu Hamamoto, both of Tokyo, Japan

[73] Assignee: Anritsu Electric Company Limited, Tokyo, Japan

[21] Appl. No.: 135,711

[22] Filed: Mar. 31, 1980

[30] Foreign Application Priority Data

Mar. 31, 1979 [JP] Japan .................. 54-37744

[51] Int. Cl.³ .......................................... H01J 29/70
[52] U.S. Cl. ..................................... 315/367; 315/389
[58] Field of Search .................. 315/367, 389, 398; 328/228

[56] References Cited

U.S. PATENT DOCUMENTS 3,396,306  8/1968  Mallebrein .................. 315/367
3,996,582  12/1976  Sinobad ..................... 315/367 X
4,099,092  7/1978  Bristow ...................... 315/367 X Primary Examiner—Malcolm F. Hubler
Attorney, Agent, or Firm—Holman & Stern

[57] ABSTRACT

An automatic Y-axis offset system for a cathode ray tube, which performs automatic positioning of a trace to a predetermined position on the cathode ray tube face such that the trace becomes visible, by applying a Y-axis offset voltage to the input signal voltage. The automatic positioning is performed when commanded by an operator through switch actuation. The offset voltage is produced by a feedback circuit which includes an amplifier receiving the input signal, a comparator for comparing an output voltage from the amplifier with a predetermined level, a counter which is enabled to count a clock signal so long as the level of output signal from the amplifier is different from the predetermined level, and a digital-to-analog converter which converts the count in the counter to an analog signal constituting the Y-axis offset voltage.

4 Claims, 3 Drawing Figures

AUTOMATIC Y-AXIS OFFSET SYSTEM

BACKGROUND OF THE INVENTION

The present invention relates to an automatic Y-axis offset system for a cathode ray tube display, which permits the position of a trace on the display to be immediately and automatically returned to a position on the tube face at which the trace is visible, when a signal having a large DC component has been applied to the display system.

It is frequently necessary to examine signals which contain a relatively high DC component, using a cathode ray tube display such as that of an oscilloscope. When such a signal is first applied to the cathode ray tube display system, then, assuming that DC coupling and amplification are provided between the input signal terminals and the deflection plates of the cathode ray tube, the voltage applied to the Y-plates of the cathode ray tube will frequently be of such a magnitude that the display trace is completely off the cathode ray tube face, i.e. is not visible. With a conventional cathode ray tube display system, it is then necessary for the operator to manually adjust the Y-axis level adjustment potentiometer to bring the trace to a position at which it becomes visible. This is a time-cosuming and troublesome task. If the adjustment sensitivity of the Y-axis level adjustment is made relatively low, so that a relatively small movement of the display trace occurs in response to movement of the Y-axis level adjustment control by a certain amount, then it is possible to adjust the position of the trace in a convenient and precise manner. However, in this case, bringing the trace to a visible position on the cathode ray tube screen, when it has been displaced off the screen by a large input signal voltage as described above, becomes excessively time-consuming. If, on the other hand, the Y-axis level adjustment sensitivity is made relatively high, so that a small amount of movement of the adjustment control results in a relatively large displacement of the trace on the display tube face, then although the trace can be fairly rapidly brought to a position of visibility when it has disappeared off the tube face due to the application of a high input signal voltage, subsequent adjustment of the position of the trace cannot be performed in a precise and convenient manner.

There is therefore a requirement for a system which will automatically position the trace on the cathode ray tube face at a position where it becomes visible, irrespective of the DC voltage level of the input signal, before examination of that signal is begun. This requirement is met by the present invention, which performs such initial positioning of the trace in an automatic and rapid manner.

SUMMARY OF THE INVENTION

The present invention comprises an automatic Y-axis offset system for a cathode ray tube display, which automatically generates an offset voltage, upon a command by the operator, which is of such a magnitude and polarity as to bring a trace on the cathode ray tube to a predetermined position on the tube face at which the trace is visible to the operator. The system comprises a first amplifier, which receives the input signal, a comparator which compares the amplified input signal provided from the output of the first amplifier with a predetermined reference voltage level, and produces an output signal which switches from one potential to another potential when said amplified input signal level attains coincidence with the reference voltage level, a flip-flop which is set by actuation of a switch by the operator and is reset by said potential level transition of the comparator output, a counter which receives a train of clock pulses and is enabled to count these pulses while the flip-flop is in the set condition, and a digital-to-analog converter which produces an offset voltage by converting the count value in the counter to an analog signal. The value of the reference voltage level corresponds to a level of the amplified input signal at which the signal trace appears at a predetermined visible position on the cathode ray tube face. The amplified input signal is applied through a second amplifier to the Y-deflection plates of the cathode ray tube.

Thus, if no trace is visible on the cathode ray tube face when a signal is initially input, then the operator actuates the above-mentioned switch causing an offset voltage to modify the level of the input signal and having a magnitude such that the trace is deflected in the Y-direction to the predetermined visible position. Once this value of offset voltage has been generated, further counting by the counter circuit is inhibited, so that the value of offset voltage is left unchanged until the operator again actuates the switch.

DESCRIPTION OF THE PREFERRED EMBODIMENT

Figure 1:
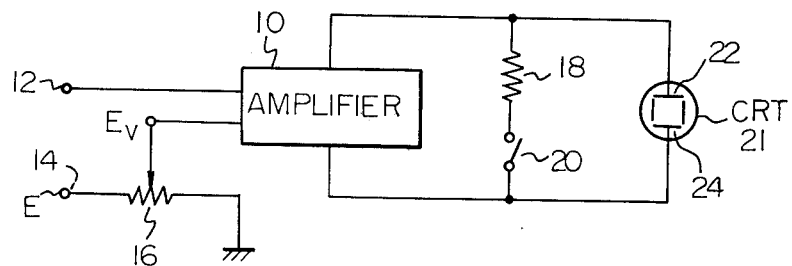
FIG. 1 is a simplied block diagram of a conventional system for applying an offset voltage to an input signal of a cathode ray tube display system.

Referring first to FIG. 1, a typical conventional system for applying a Y-axis offset voltage to a cathode ray tube display system is shown. An input signal is applied between an input terminal designated by reference numeral 12 and ground. A DC voltage of value E is applied to a terminal 14 of a potentiometer 16. A Y-axis offset voltage is developed at the slider of potentiometer 16, of value Ev, and is applied to one input of an amplifier circuit 10, while the input signal is applied to the other input of amplifier 10. It should be noted that the term "amplifier" as used herein refers to a DC-coupled amplifier. Deflection signals produced by amplifier 10 are applied to Y-plates 22 and 24 of a cathode ray tube 21. A resistor 18 and a switch 20 are connected in series across the Y-plates 22 and 24, as described below.

Figure 2:
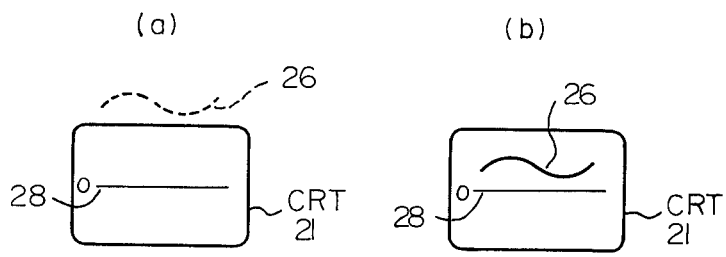
FIG. 2 is a diagram illustrating the positioning of a trace on a cathode ray tube in the Y-direction.

FIG. 2 (a) illustrates the case in which an input signal applied to terminal 12 contains a DC component of such a magnitude that the trace 26 of the cathode ray tube display is deflected in the Y-direction by an excessive amount, so that the trace 26 is no longer visible on the display. The trace position for an input voltage level of zero is indicated by numeral 28. In order to bring the trace 26 into a position at which it is visible, with the conventional system of FIG. 1, the operator first actuates switch 20, thereby connecting resistor 18 across the Y-plates 22 and 24. This attenuates the output from amplifier 10, thereby reducing the effective amplification of amplifier 10. As a result, the degree of deflection of trace 26 is reduced to an extent whereby the trace becomes visible on the tube face, as indicated in FIG. 2(b). Then, observing the position of trace 26, the operator adjusts potentiometer 16 to set the level of Y-axis offset voltage to a value such that trace 26 attains the zero position indicated by numeral 28. If this is done then, when the operator releases switch 20, the trace 26 will be visible on the cathode ray tube face.

It will be apparent that the manual operations involved in actuating switch 20, adjusting potentiometer 16, and then releasing switch 20, are time-consuming and inconvenient. Since the range of offset voltages which can be developed by potentiometer 16 must be sufficiently wide to enable the trace 26 to be brought to a central position on the display face even for very high levels of input voltage, it is inevitable that a relatively small amount of movement of potentiometer 16 will result in a relatively large displacement of the trace 26 when positioning of the trace is being performed. In other words, the adjustment sensitivity is high, so that positioning of the trace 26 is difficult.

Another disadvantage of such a conventional system is that the incorporation of components such as resistor 18 and switch 20 into the amplifier circuit may result in a deterioration of the high-frequency characteristics of the display system.

Figure 3:
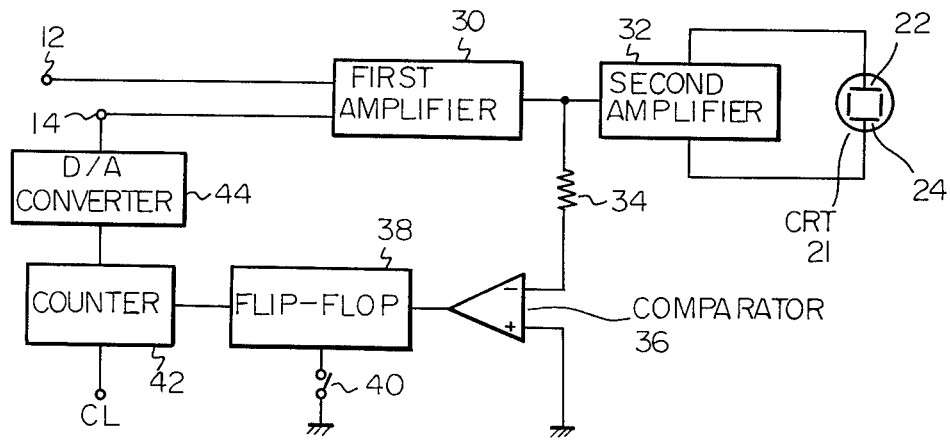
FIG. 3 is a simplified block diagram of a automatic Y-axis offset system according to the present invention.

Referring now to FIG. 3, an embodiment of a automatic Y-axis offset system according to the present invention is shown, in simplified block diagram form. Here, essentially, a first amplifier 30, a comparator 36, a memory circuit which comprises, a flip-flop 38, counter 42 and a digital-to-analog (hereinafter abbreviated to D/A) converter 44 are connected in such a way as to develop a Y-axis offset voltage at terminal 14 automatically, when a switch 40 is actuated. The output from first amplifier 30, i.e. the amplified input signal, is input to a second amplifier 32, the output of which drives Y-deflection plates 22 and 24 of cathode ray tube 21.

The operation of the system of FIG. 3 will now be described. If it is assumed that the input signal voltage applied to input terminal 12 is at a potential which is higher than zero, i.e. higher than ground potential, then the output from first amplifier 30, applied through a very high value resistor 34 to an input of comparator 36, will also be above zero potential. The output signal from comparator 36 will therefore be at either of two possible potential levels, which we shall refer to as the first potential for convenience. If the input signal voltage applied to terminal 12 is of such a magnitude that the trace on cathode ray tube 21 is excessively deflected, such as to be no longer visible as shown in FIG. 2(b), then the operator actuates switch 40 once, thereby momentarily applying a start signal comprising a zero-voltage input signal to flip-flop 38. Flip-flop 38 is thereby triggered, such as to deliver a control signal to counter 42 at a potential which enables counter 42 to begin counting a train of clock pulses which are input thereto from a source of clock pulses. The count in counter 42 is converted into an analog voltage level by D/A converter 44, to produce an offset voltage which is applied to input terminal 14 of first amplifier 30. In this embodiment of the present invention, the offset voltage is effectively subtracted from the level of the input signal applied to terminal 12. Thus, as the count in counter 42 increases and the level of the offset voltage applied to terminal 14 accordingly increases, the level of the output voltage from first amplifier 30 falls. When this output voltage level reaches that of the reference voltage of comparator 36, i.e. ground potential for the embodiment of FIG. 3, the output from comparator 36 switches from the first potential (mentioned above) to a second potential, i.e. the output signal from comparator 36 is inverted. As a result, flip-flop 38 is triggered so that the potential of the control signal applied therefrom to counter 42 is inverted, thereby inhibiting further counting by counter 42. The level of the offset voltage produced by D/A converter 44 is thereby held at the value which causes the output voltage from amplifier 30 to become identical to the reference voltage applied to comparator 36. Thus, the trace 26 on the cathode ray tube will be automatically set at a position corresponding to an input level of zero volts to second amplifier 32, i.e. to a position such as is indicated by numeral 28 in FIG. 2. The value of Y-axis offset voltage thus developed at the output of D/A converter 44 will be held constant until the next occasion when the operator actuates switch 40.

From the above description, it will be apparent that the present invention presents significant advantages with respect to convenience and ease of operation, when positioning the trace of a cathode ray tube display in a visible position after an input signal having a high DC component has been applied to the display.

It should be noted that, for simplicity of description, no provisions have been specifically described in the embodiment of FIG. 3 whereby the offset voltage is automatically adjusted for extreme input signal voltage levels of both positive and negative polarity. However modification of the embodiment of FIG. 3 to accomplish this can obviously be achieved by utilizing an up/down counter as counter 42, and by controlling the operation of this counter in accordance with whether the level of the input signal applied to terminal 12 is initially positive or negative with respect to the reference voltage applied to comparator 36.

It should also be noted that, although for the embodiment of FIG. 3 the reference voltage applied to comparator 36 is shown as ground potential, it is also possible to utilize any other suitable potential as the reference voltage level.

Since the value of resistor 34 can be made extremely high, it will be apparent that the Y-axis offset system of the present invention need not cause any significant effect upon the frequency response or other characteristics of a cathode ray tube display system in which it is incorporated.

It should also be noted that, although in the embodiment of FIG. 3, actuation of the switch 40 to initiate the production of a Y-axis offset voltage automatically is performed manually by an operator, it is equally possible to arrange the system such that, when it is detected that an applied input signal voltage is of such a value that the cathode ray tube trace will be outside the visible range, generation of a Y-axis offset voltage of suitable value is automatically performed.

Thus, although the present invention has been shown and described with respect to a specific embodiment, various changes and modifications to that embodiment are possible, which fall within the scope claimed for the present invention. The description of the preferred embodiment above should therefore be interpreted in an illustrative and not in a limiting sense.

We claim:

1. An automatic Y-axis offset system for a cathode ray tube, comprising:

a first amplifier circuit for amplifying an input signal and for thereby producing an output signal coupled to Y-axis deflection plates of said cathode ray tube;

comparator circuit means coupled to compare the level of said output signal from said first amplifier circuit with a predetermined voltage reference level, and for producing an output signal when the level of said output signal from said first amplifier exceeds said reference voltage level;

means for producing a start signal;

memory circuit means responsive to said start signal for being set to produce a control signal, and responsive to said output signal from said comparator circuit means for being reset to inhibit production of said control signal;

a source of clock pulses;

a counter circuit which is responsive to said control signal for being enabled to count said clock pulses;

a digital-to-analog converter circuit coupled to said counter circuit, for converting a count value held in said counter circuit into an analog signal constituting an offset voltage;

said offset voltage being applied to an input terminal of said first amplifier circuit such as to cause the level of said output signal from said first amplifier circuit to approach said reference voltage level after said start signal has been applied, said reference voltage level corresponding to a level of said output signal from said first amplifier circuit at which a trace appearing on said cathode ray tube is set at a predetermined position.

2. An automatic Y-axis offset system for a cathode ray tube according to claim 1, in which said means for producing a start signal comprises a manually actuated switch.

3. An automatic Y-axis offset system for a cathode ray tube according to claim 1, in which said memory circuit means comprises a flip-flop circuit coupled to be set by said start signal and to be reset by said output signal from said comparator circuit means.

4. An automatic Y-axis offset system for a cathode ray tube according to claim 1, and further comprising a second amplifier circuit coupled between said output of said first amplifier circuit and said Y-axis deflection plates.

* * * * *